United States Patent
Mehrotra

(10) Patent No.: US 8,877,595 B2
(45) Date of Patent: Nov. 4, 2014

(54) TRANSISTOR STRUCTURE WITH SILICIDED SOURCE AND DRAIN EXTENSIONS AND PROCESS FOR FABRICATION

(75) Inventor: Manoj Mehrotra, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 225 days.

(21) Appl. No.: 13/287,409

(22) Filed: Nov. 2, 2011

(65) Prior Publication Data

US 2012/0104503 A1 May 3, 2012

Related U.S. Application Data

(60) Provisional application No. 61/409,171, filed on Nov. 2, 2010.

(51) Int. Cl.
*H01L 21/336* (2006.01)
*H01L 21/8238* (2006.01)
*H01L 29/66* (2006.01)
*H01L 21/285* (2006.01)

(52) U.S. Cl.
CPC ...... *H01L 21/823864* (2013.01); *H01L 21/823814* (2013.01); *H01L 29/66507* (2013.01); *H01L 21/28518* (2013.01); *H01L 29/6653* (2013.01)

USPC .................................. 438/300; 257/E21.199

(58) Field of Classification Search
USPC .................................. 438/300; 257/E21.199
See application file for complete search history.

(56) References Cited

U.S. PATENT DOCUMENTS 7,211,515 B2 * 5/2007 Lee et al. ....................... 438/682
2007/0114611 A1 * 5/2007 Chidambarrao et al. ..... 257/355

* cited by examiner

*Primary Examiner* — Amar Movva
(74) *Attorney, Agent, or Firm* — Jacqueline J. Garner; Frederick J. Telecky, Jr.

(57) ABSTRACT

A transistor is formed in a semiconductor substrate with a gate over a channel region, source/drain extension regions in the substrate adjacent the channel region, and source/drain regions in the substrate adjacent the source/drain extension regions. Silicide is formed on the source/drain extension regions and the source/drain regions so that the silicide has a first thickness over the source/drain extension regions and a second thickness over source/drain regions, with the second thickness being greater than the first thickness. Silicide on the source/drain extension regions lowers transistor series resistance which boosts transistor performance and also protects the source/drain extension regions from silicon loss and silicon damage during contact etch.

14 Claims, 15 Drawing Sheets

TRANSISTOR STRUCTURE WITH SILICIDED SOURCE AND DRAIN EXTENSIONS AND PROCESS FOR FABRICATION

This application claims the benefit of U.S. Provisional Application No. 61/409,171, filed Nov. 2, 2010, the entirety of which is herein incorporated by reference.

FIELD OF THE INVENTION

This invention relates to the field of integrated circuits. More particularly, this invention relates to a semiconductor device having a transistor with silicide on both the source and drain extensions and on the deep source and drain diffusion layers in integrated circuits.

BACKGROUND OF THE INVENTION

In conventional transistor structures, unsilicided source and drain extension regions may be formed between the transistor gate and silicided source and drain regions. These unsilicided source and drain extension regions have significant resistance which is in series with the transistor and significantly degrades the transistor performance.

In addition, in highly scaled semiconductor devices, the contact to gate space design rule is sufficiently small that the contact may land in part on the source/drain extensions. This is especially true when the contact is oversized or misaligned. Contact etch has much higher selectivity to silicide than it does to implanted silicon. In situations where the contact lands in part on the source/drain extensions, the contact etch step will etch part of the silicon and dopant from the exposed source/drain extensions. Loss of silicon and dopant from the source/drain extension causes higher series resistance degrading transistor performance. The contact etch may damage the silicon in the source/drain extension region which may give rise to increased junction leakage and higher standby current.

FIG. 1 shows a conventional transistor 1000 that has been processed through contact formation. The transistor includes a channel region 1002, a gate dielectric 1010, a polysilicon gate region 1020, offset spacer oxide 1012 and nitride 1014, sidewall spacer oxide 1016 and nitride 1018, source and drain extension regions 1004, source and drain diffusion regions 1006, source and drain silicide regions 1008, gate silicide region 1022, interlevel dielectric layer 1028, and contacts 1026. Contacts 1026 land in part on source/drain extensions 1004. As seen if FIG. 1, the etch process forming openings for contacts 1026 has etched away a significant portion of source and drain extensions 1004 so that contact portions 1030 extending from the bottom of contacts 1026 extend into source/drain extensions 1004.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides a transistor structure with silicide on source/drain regions and on source/drain extension regions. The silicide on the source/drain extension regions has a thickness less than the thickness of the silicide on the source/drain regions. The silicide on the source/drain extension regions lowers the series resistance of the transistor giving the transistor a performance boost and protects the source/drain extension regions from silicon loss and silicon damage during contact etch.

DETAILED DESCRIPTION

Figure 1:
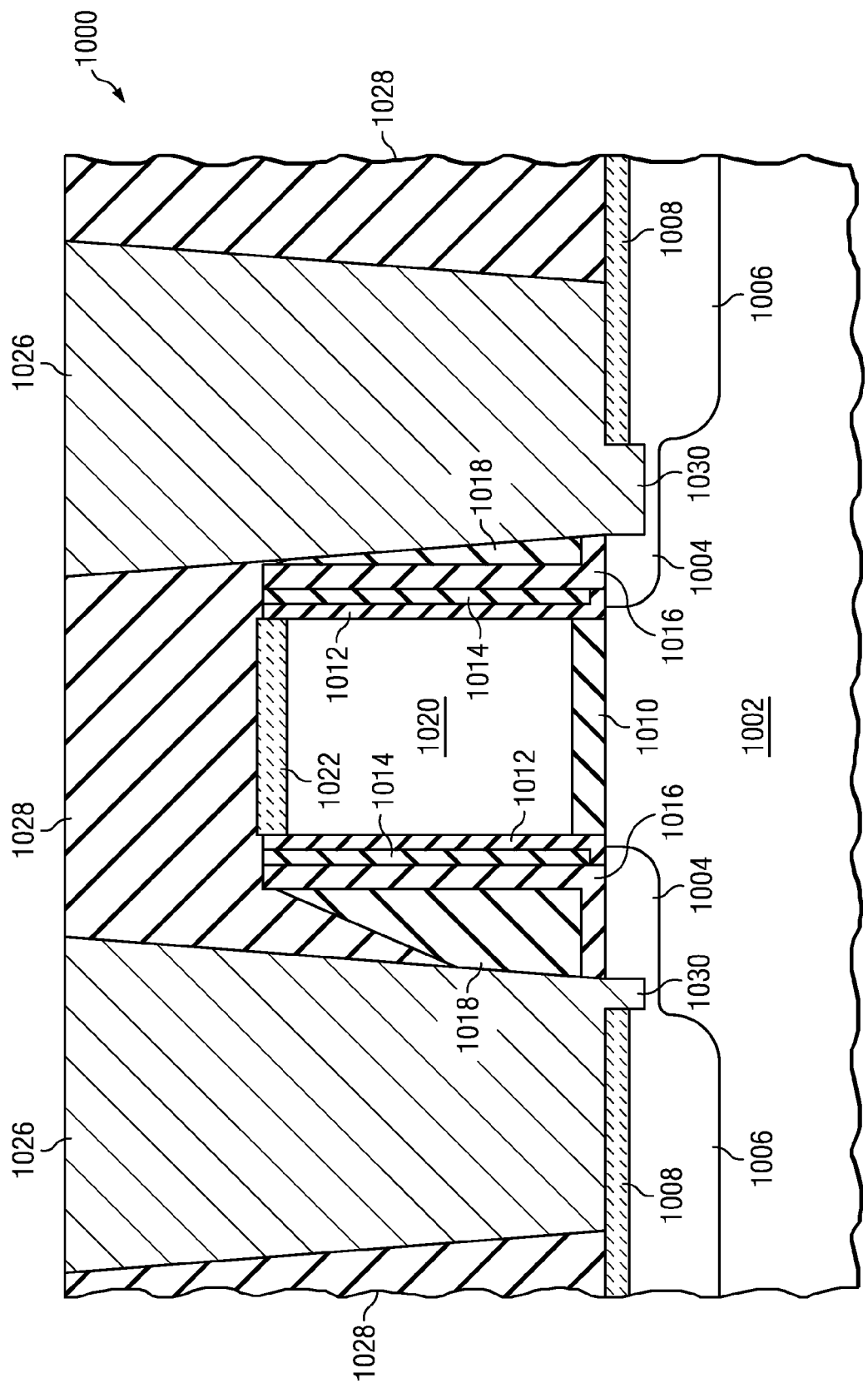
FIG. 1 is a cross-sectional view of a conventional transistor that has been processed through contact formation.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIGS. 2A through 2F are cross-sectional views of a transistor having silicided source/drain extensions at various stages of construction according to one embodiment of the invention. The transistor structure shown is for illustrative purposes. Other transistor structures with source and drain extensions and source and drain regions would also benefit from this invention.

Figure 2A:
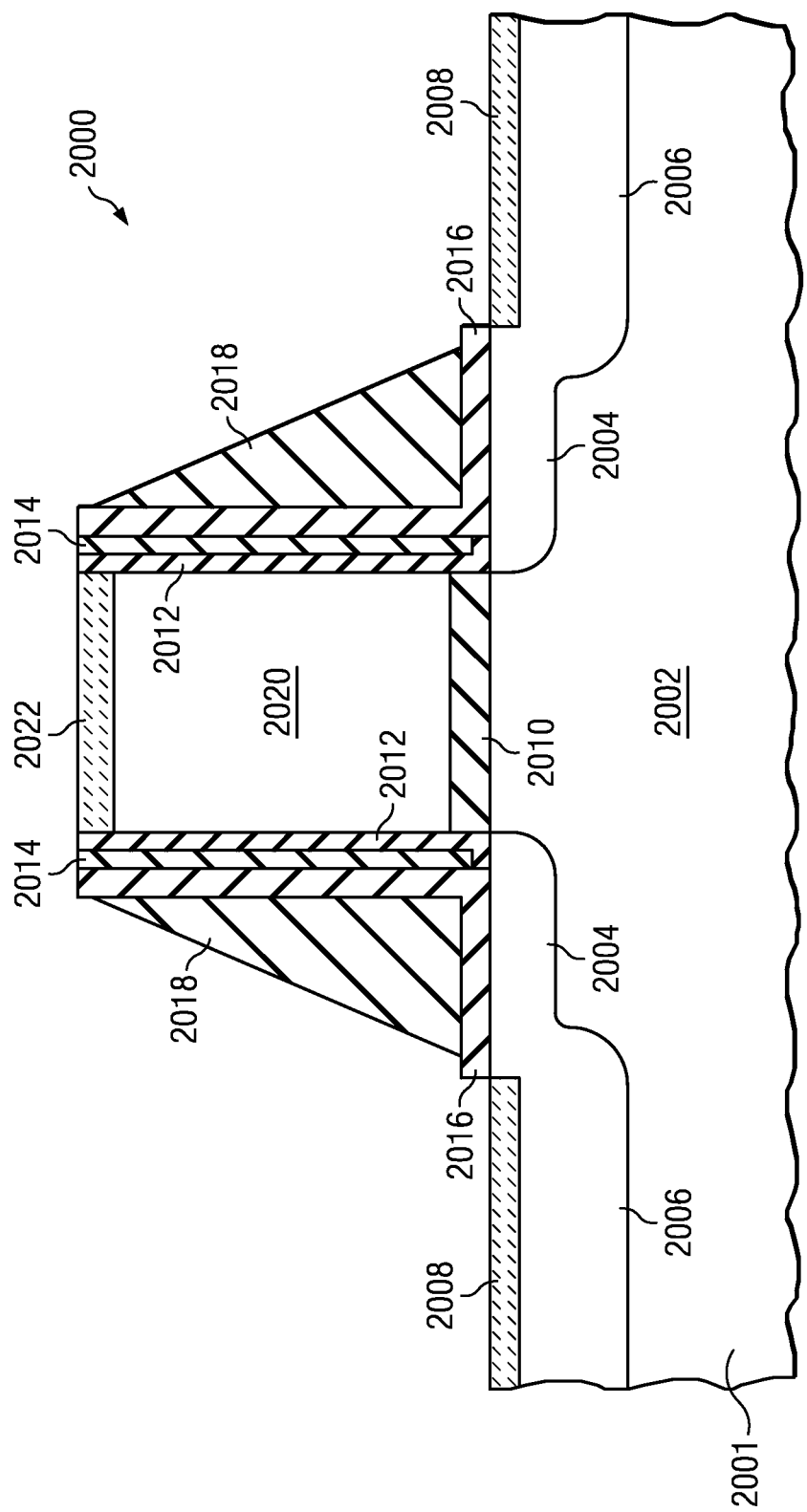
FIG. 2A through FIG. 2F are cross-sectional views of a transistor at various stages of construction according to embodiments of this invention.

FIG. 2A shows a transistor 2000 that has been processed through silicidation of the gate and the source and drain regions. The transistor includes a silicon substrate 2001, a channel region 2002, a gate dielectric layer 2010, a gate region 2020 over gate dielectric layer 2010 and channel region 2002, offset dielectric layers 2012 and 2014, sidewall dielectric layers 2016 and 2018, source and drain extension regions 2004 adjacent channel region 2002, source and drain diffusion regions 2006 adjacent source and drain extension regions 2004, source and drain silicide regions 2008, and gate silicide region 2022. The transistor structures listed are formed using conventional processing. Source and drain extension regions 2004 are shallower than source and drain diffusion regions 2006. Offset dielectric layers 2012 and sidewall dielectric layers 2016 may be formed from silicon oxide, for example. Offset dielectric layers 2014 and sidewall dielectric layers 2018 may be formed from silicon nitride, for example. The silicide in source and drain silicide regions 2008 and gate silicide region 2022 may be a silicide of titanium, cobalt, nickel, nickel-platinum, platinum or other metal. The preferred silicide for this embodiment is nickel-platinum silicide. Although a polysilicon gate region is shown in this example embodiment, other gate materials such as metal or a metal silicide may also be used. When the gate material is a metal, silicide region 2022 would not be formed.

Figure 2B:
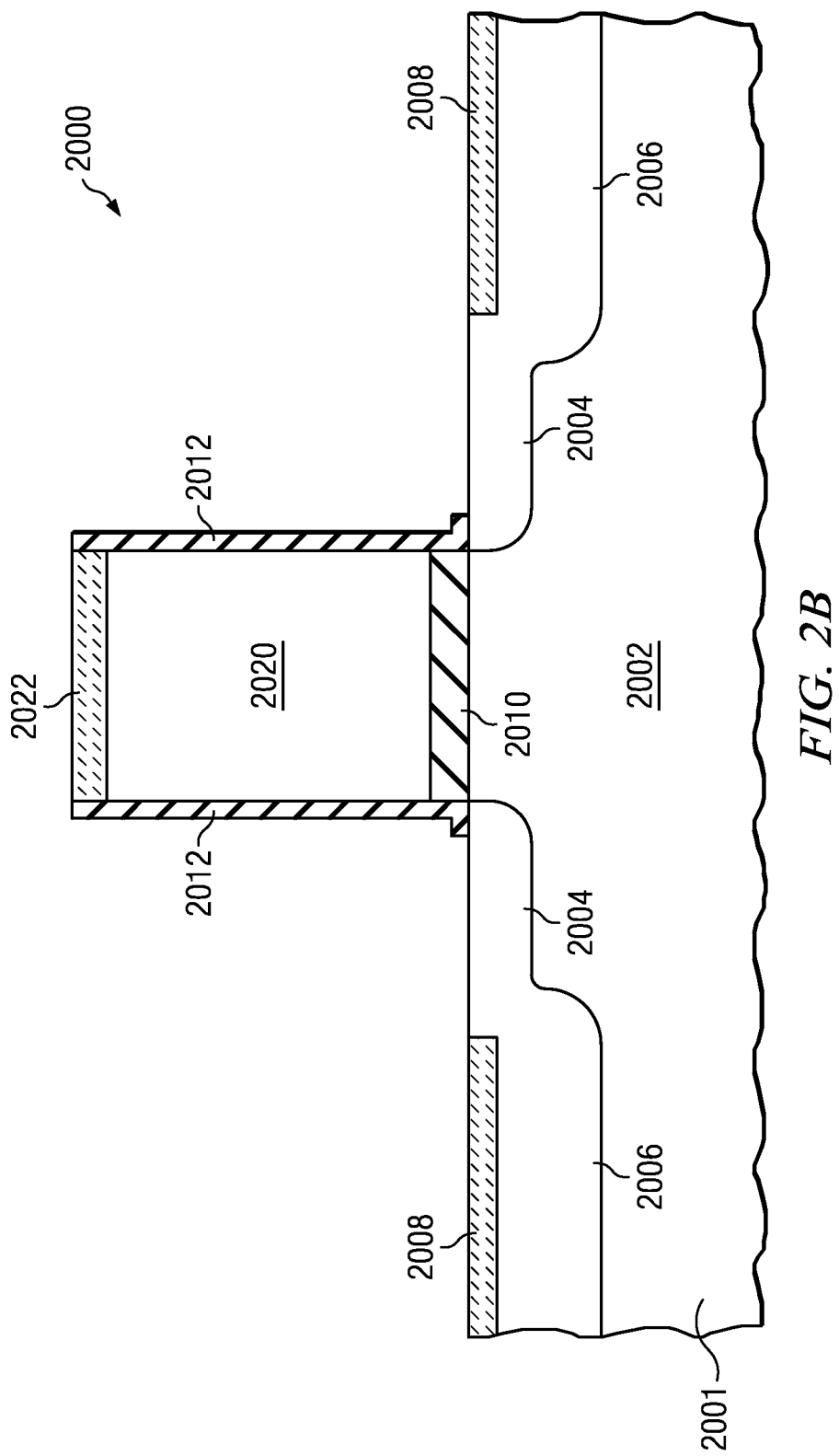

FIG. 2B shows the transistor structure 2000 after the processing steps to remove the sidewall layers 2018, 2016, and offset layer 2014 have been completed. The procedure to remove these layers is typically a wet etch using dilute HF to remove silicon dioxide and hot phosphoric to remove silicon nitride but could also be an anisotropic plasma etch. Alternatively, the sidewall removal process may remove all of the sidewall 2018 and 2016 and only a portion of the offset layer 2014 or may remove only a portion of sidewalls 2018 and 2016. At least portions of the silicon surface of the source and drain extensions 2004 are now exposed.

Figure 2C:
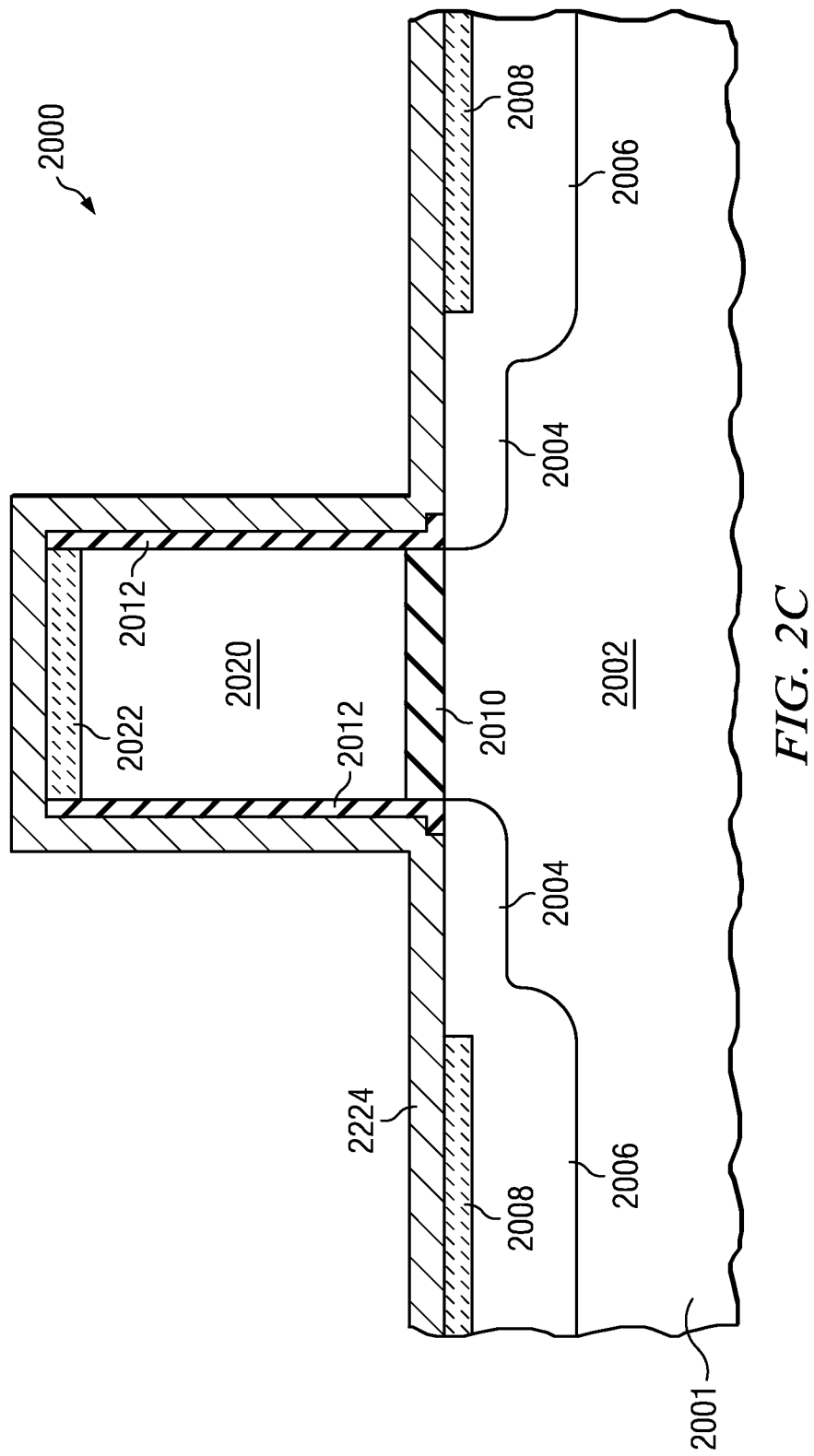

Referring now to FIG. 2C, a silicide forming metal layer 2224 such as titanium, cobalt, nickel, nickel-platinum, or platinum is deposited. It is desirable to form a thinner silicide on the source and drain extension regions 2004 than on the source and drain diffusions 2006 because the extension junctions are shallower than the source drain junctions. The bottom interface of the silicide must be sufficiently spaced from the junction to avoid excessive leakage. In one embodiment, layer 2224 is a nickel-platinum layer ranging from 2 nanometers to 6 nanometers thick and is deposited using conventional techniques. In this embodiment, a nickel-platinum layer thicker than layer 2224 and ranging from 5 nanometers to 15 nanometers thick could have been used to form source and drain silicide regions 2008. In a preferred embodiment, the thickness of layer 2224 is approximately 3 nm. In this embodiment, a nickel-platinum layer 9 nanometers thick could have been used to form source and drain silicide regions 2008.

Figure 2D:
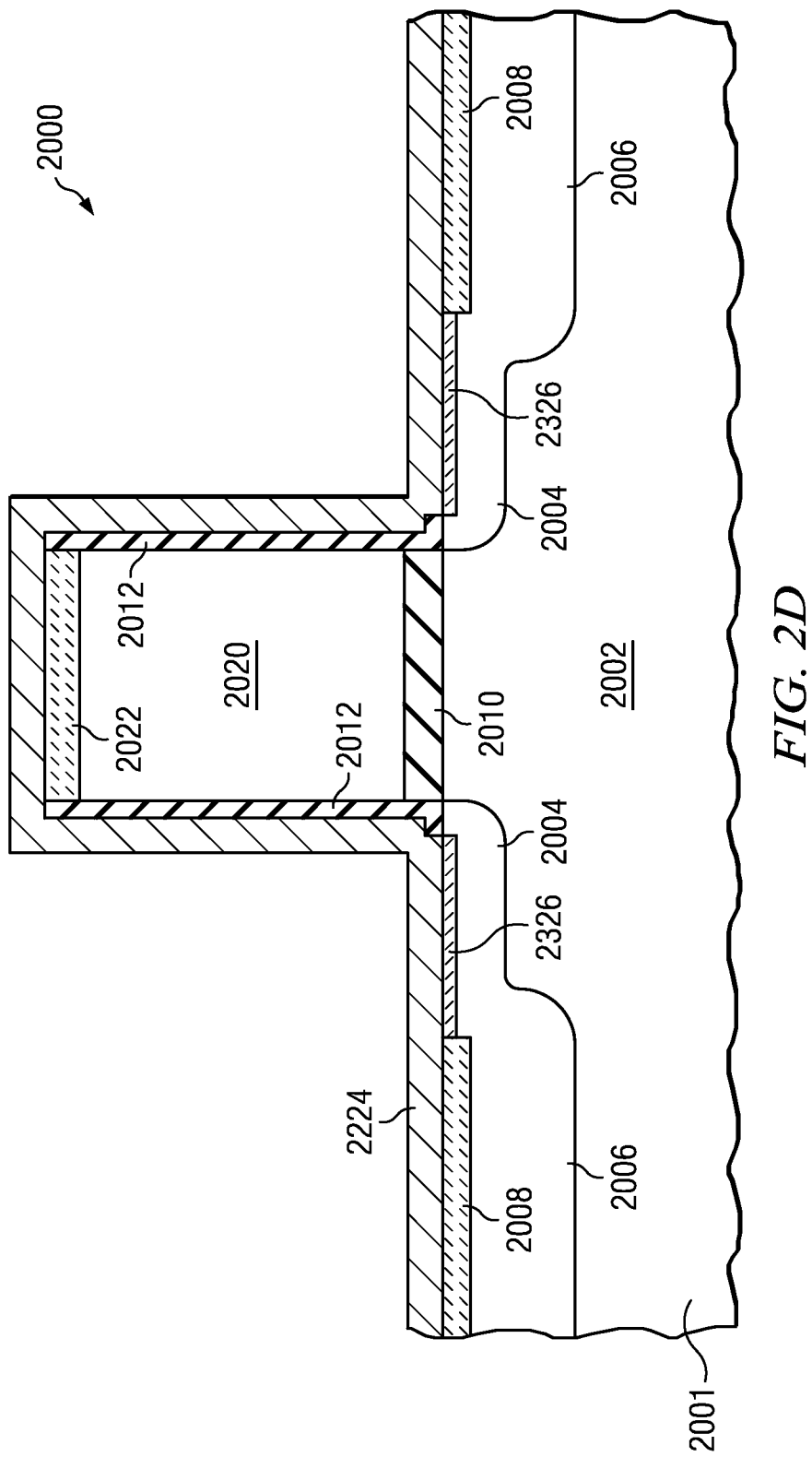

Referring now to FIG. 2D, a wafer containing the transistor structure is heated, for example from 100° C. to 500° C., to form silicide layer 2326 over the extension regions 2004 where the silicon and the metal 2224 are in contact. The thickness of the silicide over the source and drains 2008 may become slightly thicker during this process. The preferred temperature for nickel silicide is approximately 250° C.

Figure 2E:
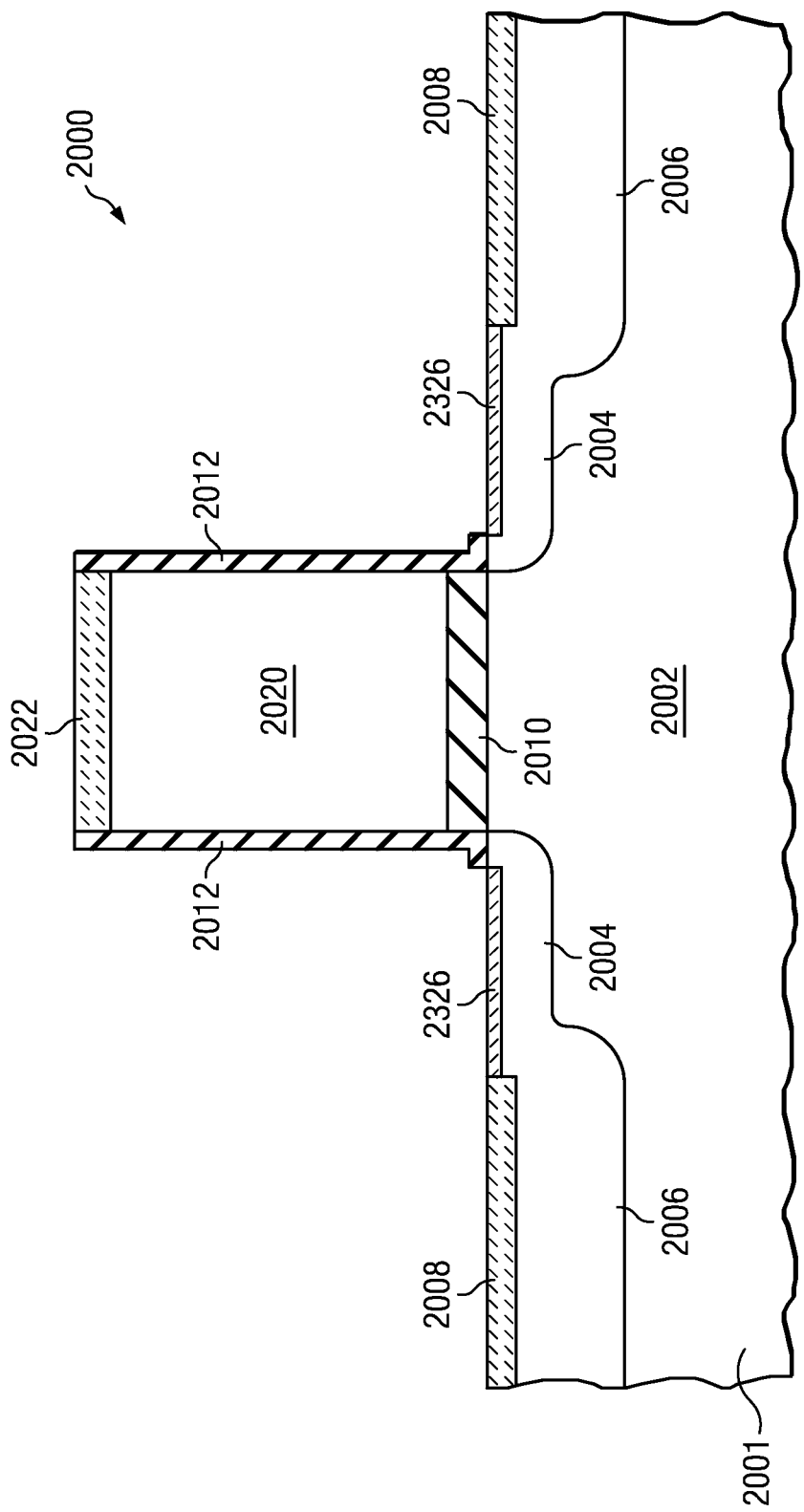

The unreacted metal is then stripped using conventional methods resulting in the structure shown in FIG. 2E. The silicide 2008 over the source and drain region 2006 may be the same or different than the silicide 2326 formed over the source and drain extension regions 2004. The preferred embodiment is to form nickel-platinum silicide over both regions. An additional silicide anneal to reduce the silicide sheet resistance may or may not be performed. This anneal may be omitted from the process flow if its impact on transistor characteristics such as short channel behavior is undesirable.

The silicide on the source and drain extension regions lowers the series resistance of the transistor thus improving the transistor performance. The silicide layer on the source and drain extension regions also provides an effective etch stop layer that protects the source and drain extensions from being partially etched away and damaged during contact etch if the contact lands on the extension regions due to being oversized or due to misalignment.

Figure 2F:
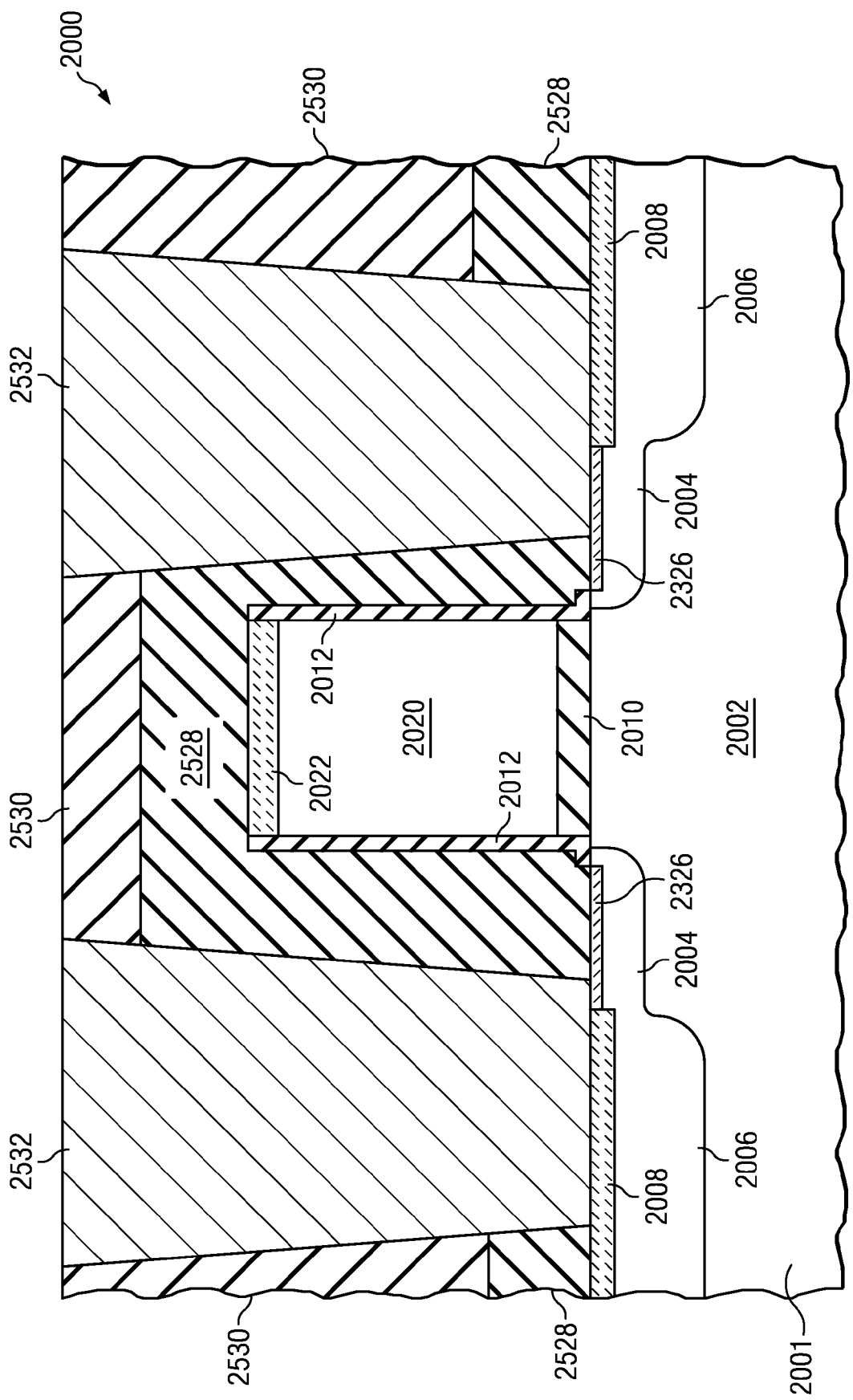

In FIG. 2F, a conformal contact etch stop layer 2528, which may be formed from silicon nitride and also act as a stress layer for providing stress to the gate, is deposited. A pre metal dielectric (PMD) layer 2530, formed from silicon dioxide, for example, is deposited and planarized. Layers 2528 and 2530 are then patterned and etched to create contact openings that are filled with a conductor, for example a metal such as tungsten, to form contacts 2532. As discussed above, silicide layers 2326 act as an etch stop to prevent etching into the source and drain extension regions 2004 when misaligned and oversized contacts are formed. Conventional processing is used to add metal interconnect layers and a passivation layer to complete the integrated circuit processing.

FIGS. 3A through 3H are cross-sectional views of a transistor with silicided source and drain extensions at various stages of construction according to another embodiment of this invention.

Figure 3A:
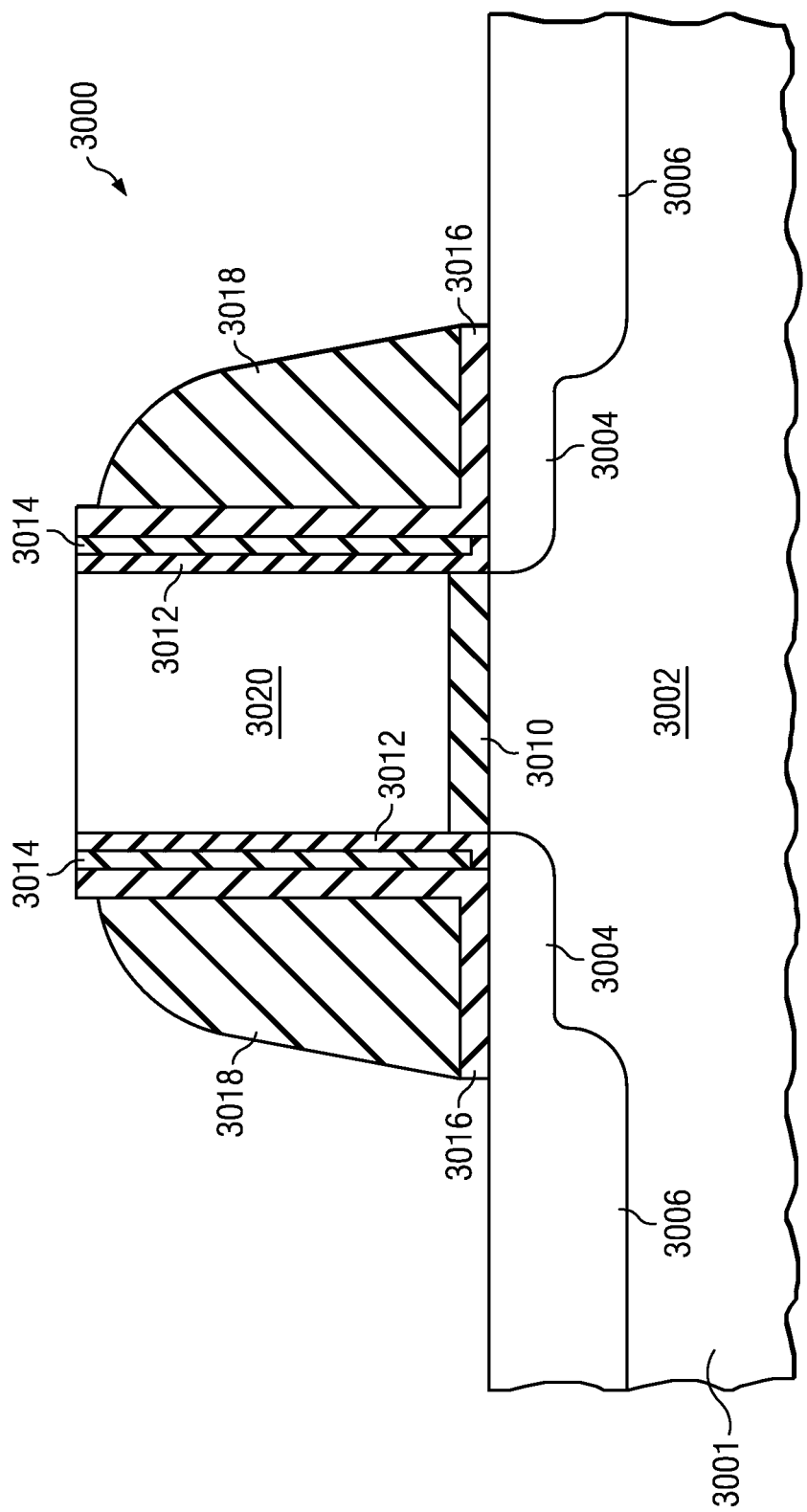
FIG. 3A through FIG. 3H are cross-sectional views of a transistor at various stages of construction according to embodiments of this invention.

FIG. 3A shows a transistor 3000 that has been processed through formation of the source and drain regions 3006. The transistor includes a silicon substrate 3002, a channel region 3002, a gate dielectric layer 3010, a polysilicon gate region 3020 over gate dielectric layer 3010 and channel region 3002, offset dielectric layers 3012 and 3014, sidewall dielectric layers 3016 and 3018, source and drain extension regions 3004, and source and drain diffusion regions 3006. Source and drain extension regions 3004 are shallower than source and drain diffusion regions 3006. Offset dielectric layers 3012 and sidewall dielectric layers 3016 may be formed from silicon oxide, for example. Offset dielectric layers 3014 and sidewall dielectric layers 3018 may be formed from silicon nitride, for example. In contrast to the first embodiment, silicide regions are not yet formed on the gate region 3020 or on the source and drain diffusion regions 3006. The gate material may be polysilicon or may be formed of another material, such as metal, in which case silicide would not be formed on top of the gate material.

Figure 3B:
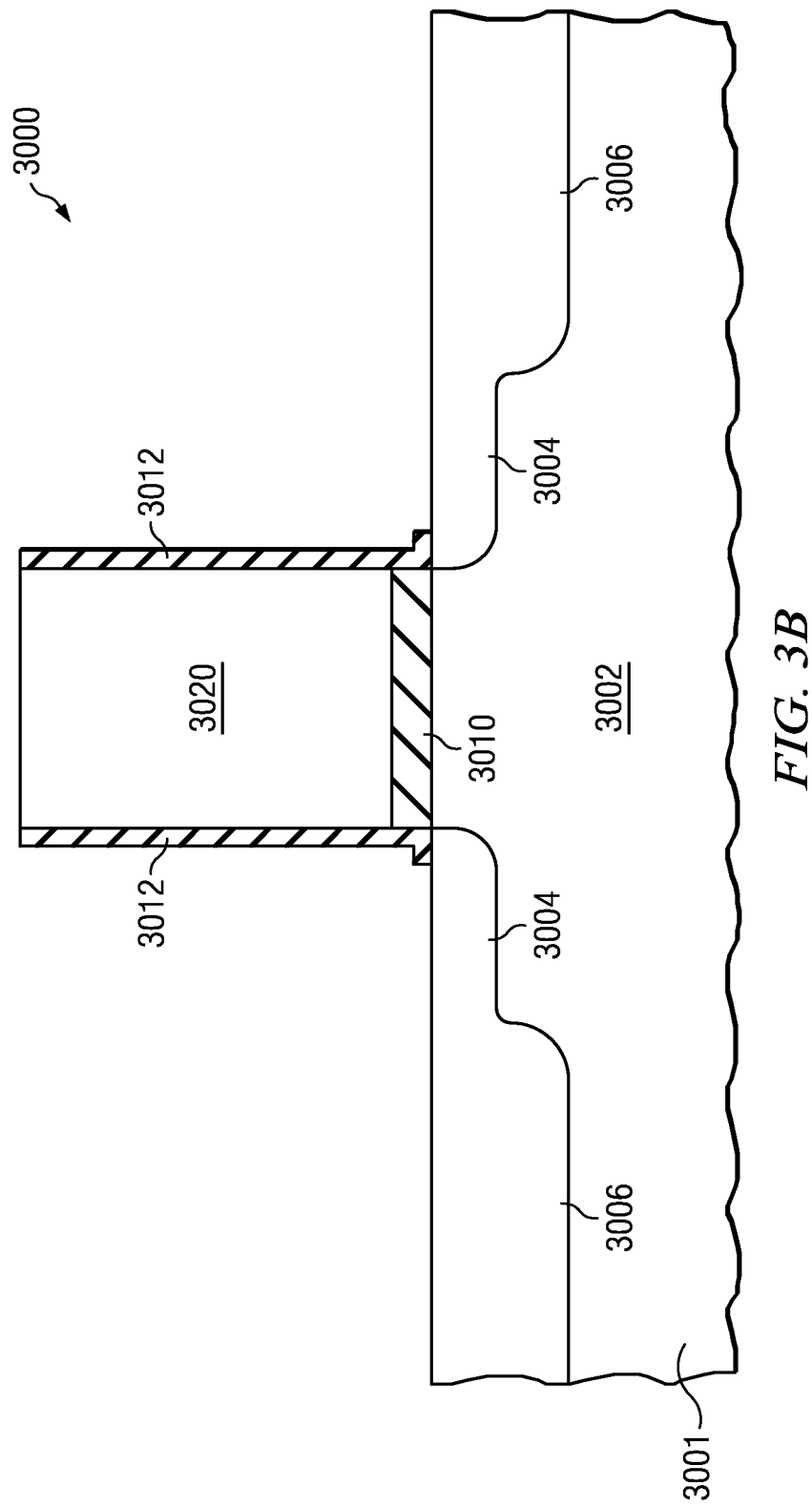

FIG. 3B shows the transistor structure after the processing steps to remove the layers 3018, 3016 and 3014 have been completed. The procedure to remove these layers is typically a wet etch using dilute HF to remove silicon dioxide and hot phosphoric to remove silicon nitride, but could also be an anisotropic plasma etch. Alternatively, the sidewall removal process may remove all of the sidewall layers 3018 and 3016 and only a portion of the offset layer 3014 or may remove only a portion of sidewall layers 3018 and 3016. At least portions of the silicon surface of the source and drain extensions 3004 are now exposed.

Figure 3C:
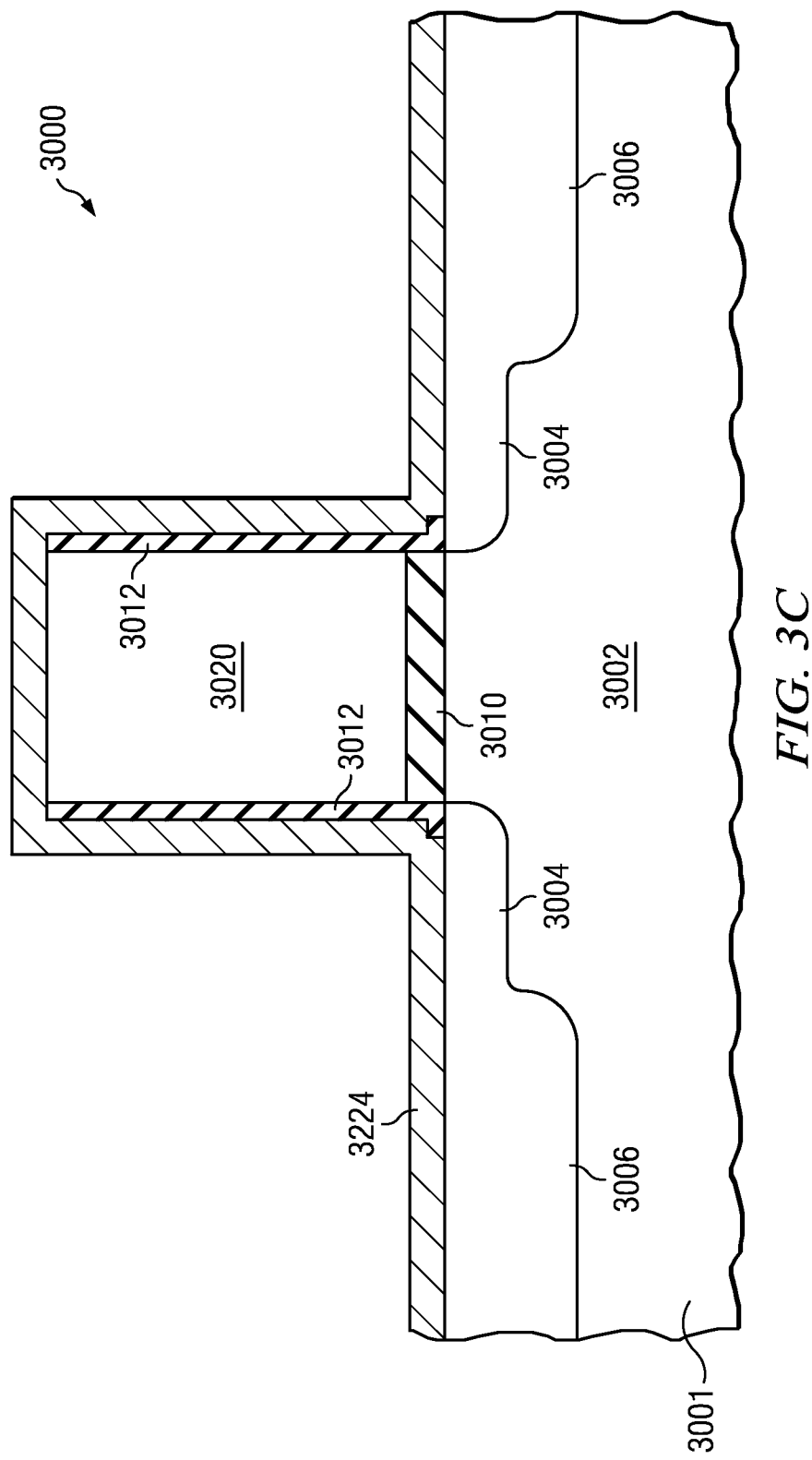

Referring now to FIG. 3C, a first silicide forming metal layer 3224 such as titanium, cobalt, nickel, nickel-platinum, or platinum is now deposited. In the preferred embodiment, a nickel platinum layer ranging from 2 nanometers to 6 nanometers is deposited using conventional techniques. The preferred thickness for this embodiment is approximately 3 nm. It is desirable to form a thinner silicide on the source and drain extension regions than on the source and drain diffusions because the extension junctions are shallower than the source drain junctions. The bottom interface of the silicide must be sufficiently removed from the junction to avoid excessive leakage.

Figure 3D:
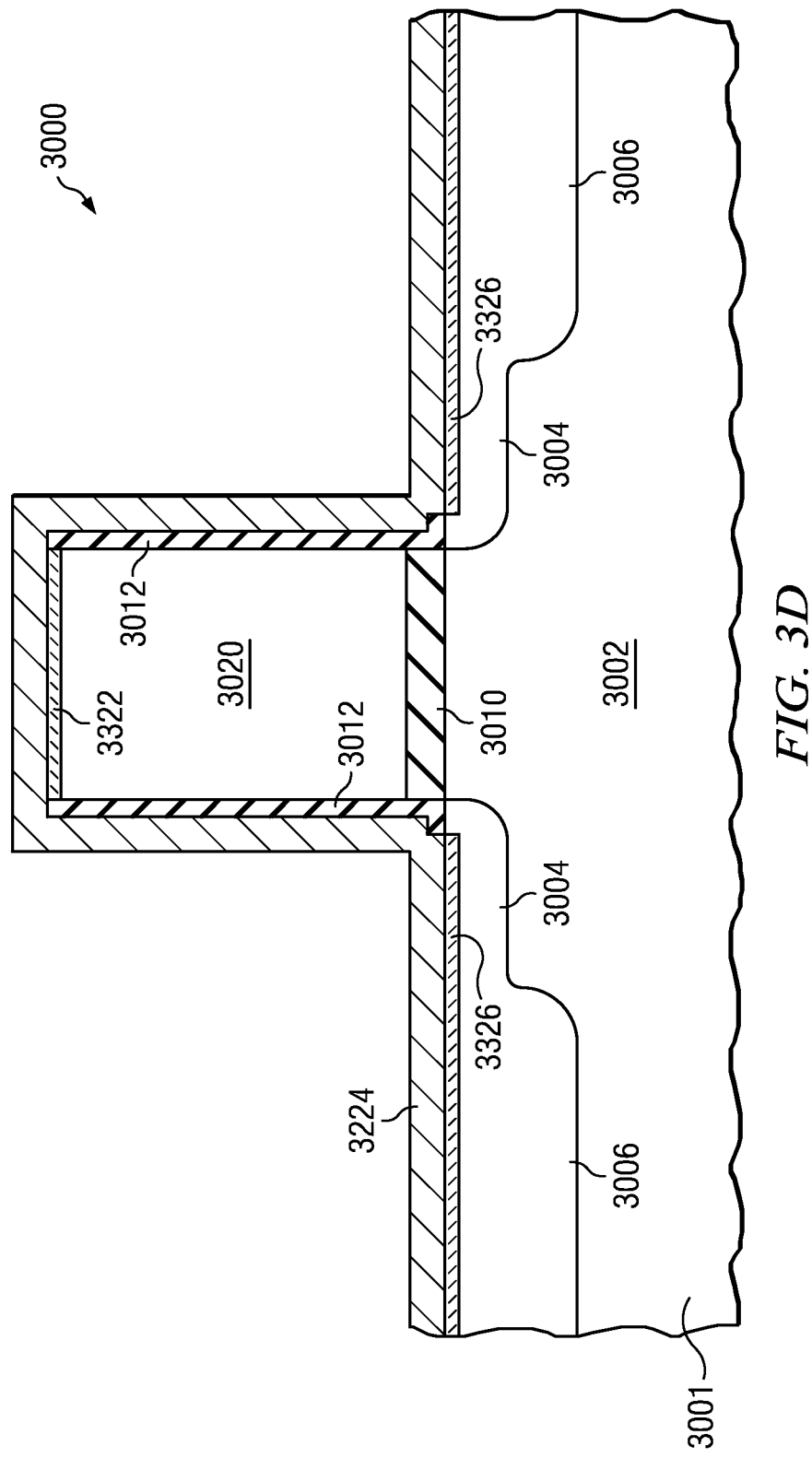

Referring now to FIG. 3D, the wafer is heated, for example from to 100° C. to 500° C., to form silicide layers 3326 over the extension regions 3004 and source and drain regions 3006 and to form silicide layer 3022 on top of the gate 3020 where the silicon and the metal 3224 are in contact. For nickel platinum, the preferred temperature is approximately 250° C.

Figure 3E:
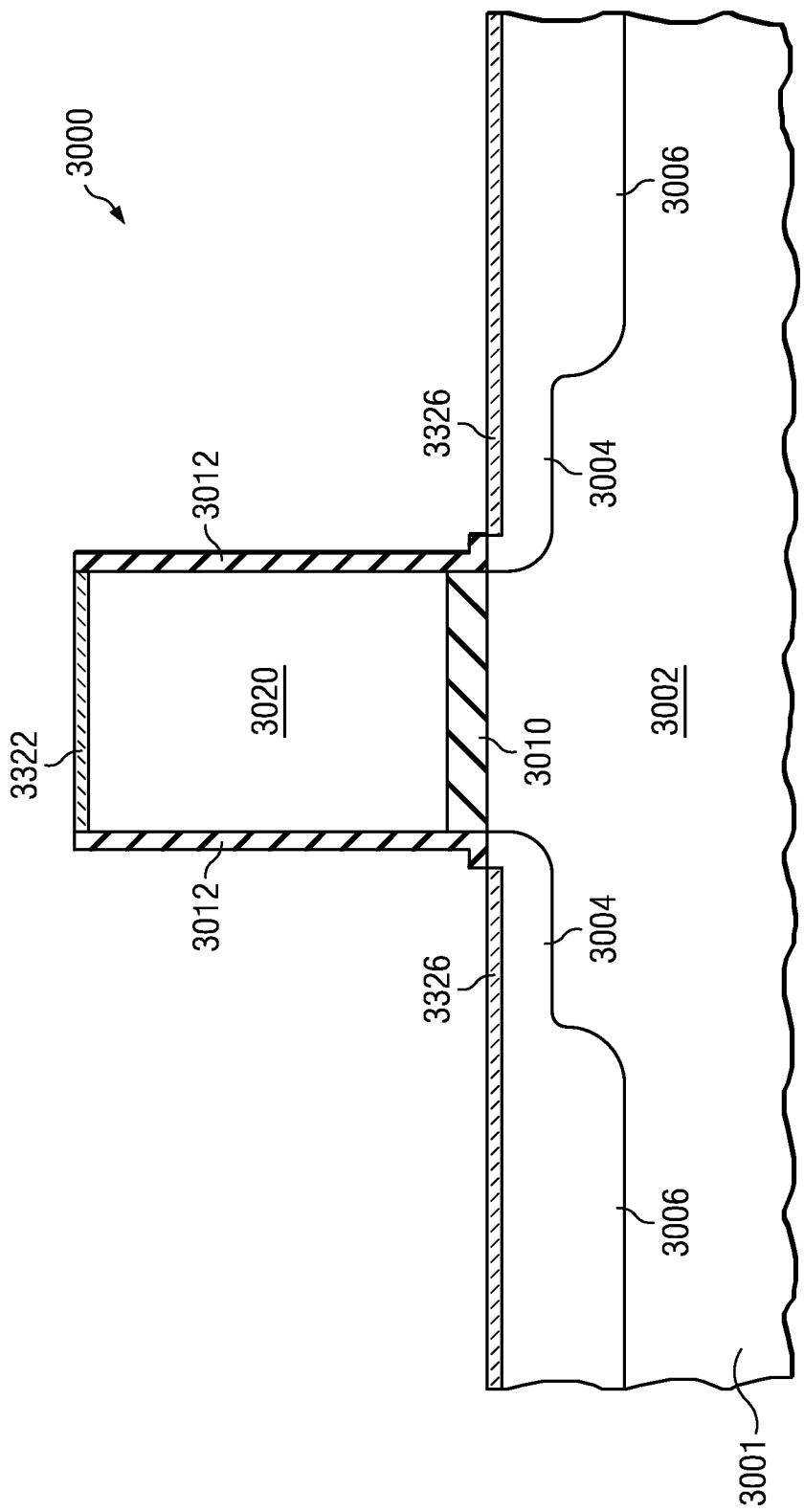

The unreacted metal is then stripped using conventional methods resulting in the structure shown in FIG. 3E.

Figure 3F:
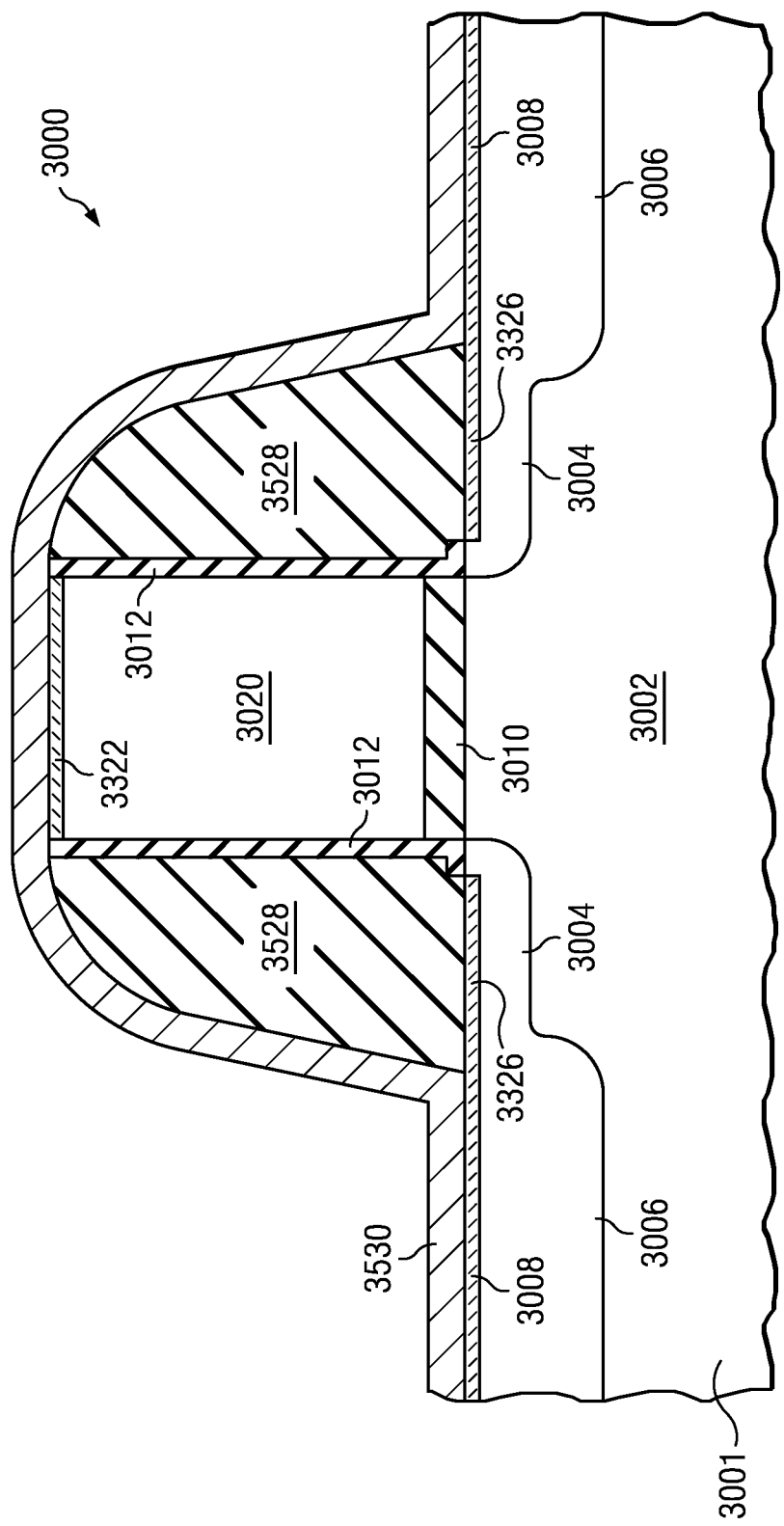

As shown in FIG. 3F, second sidewalls 3528 are now formed using conventional methods over the source and drain extensions to prevent thicker silicide from growing on the extension regions. The second sidewall, 3528, may, for example, be oxide or nitride or oxynitride deposited at a temperature at or below 500° C. to prevent the extension silicide from degrading. The preferred deposition process is PECVD oxide which is deposited at room temperature. The sidewalls are etched using a conventional anisotropic dry etch process. A second silicide forming metal layer 3530, such as titanium, cobalt, nickel, nickel-platinum, or platinum is now deposited. In one embodiment, a nickel-platinum layer ranging from 5 nanometers to 15 nanometers is deposited using conventional techniques. The preferred thickness for this embodiment is approximately 9 nm.

Figure 3G:
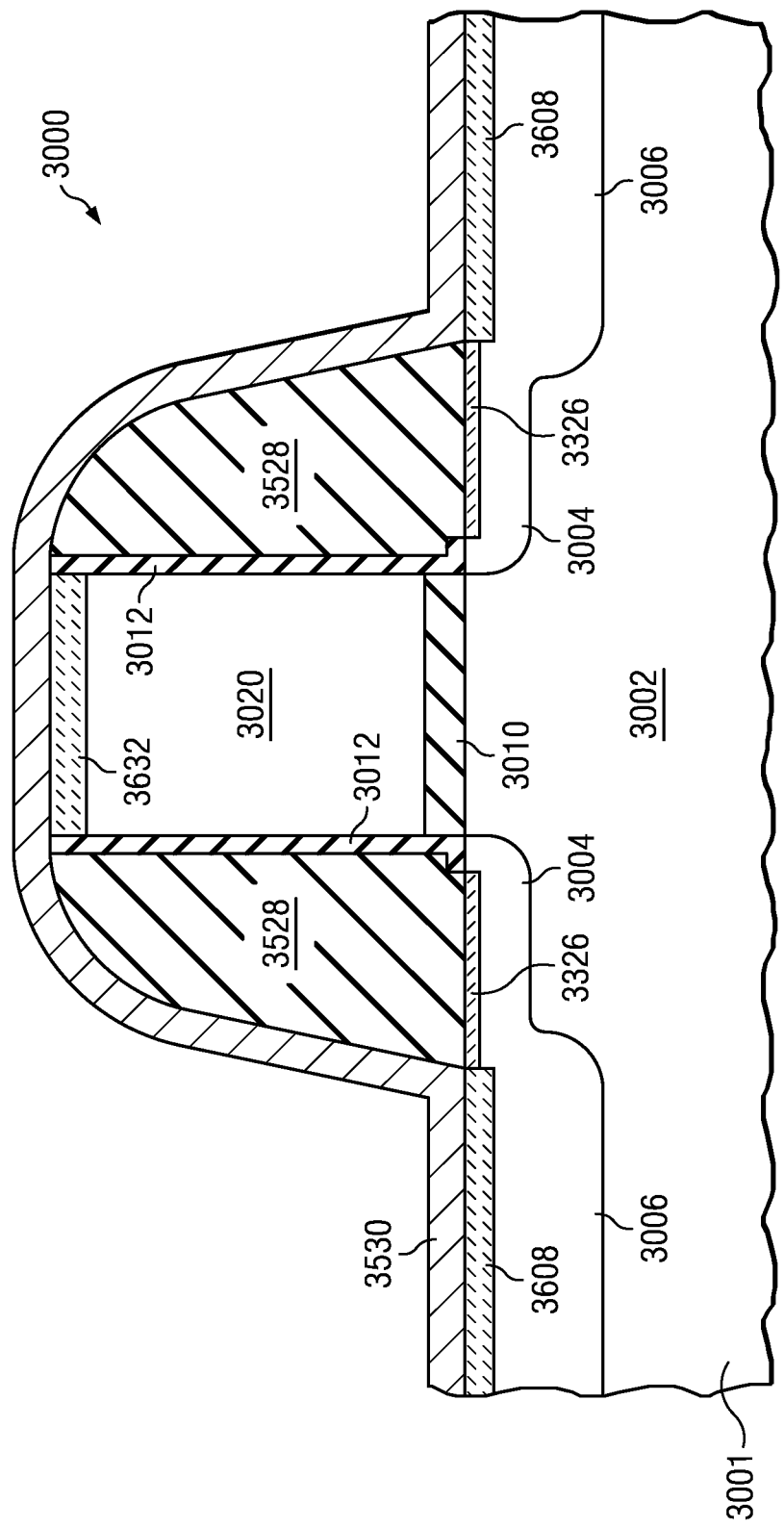

FIG. 3G shows the transistor structure after processing through a second silicide formation anneal. The anneal temperature is within a range from 250° C. to 500° C., for example, with the preferred temperature being 380° C. A thick second silicide 3608 layer is formed over the source and drain diffusion regions 3006. A thick second silicide layer 3632 may also be formed over the gate 3020 when the gate material is polysilicon.

Figure 3H:
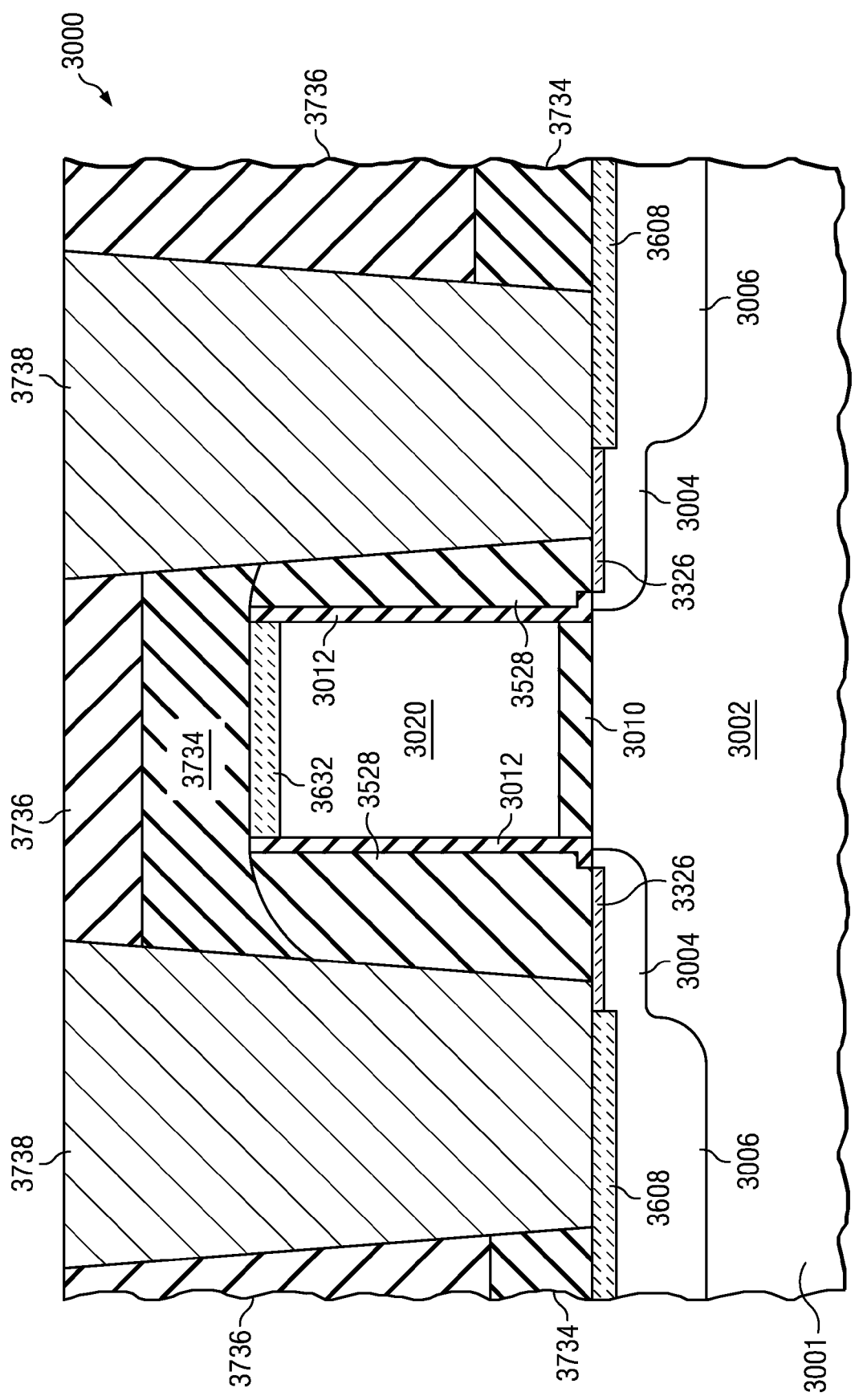

In FIG. 3H, a conformal contact etch stop layer 3734, which may be formed from silicon nitride and also act as a stress layer for providing stress to the gate, is deposited. A pre metal dielectric (PMD) layer 3736, formed from silicon dioxide, for example, is then deposited and planarized. Layers 3734 and 3736 are then patterned and etched to create contact openings that are filled with a conductor, for example a metal such as tungsten to form contacts 3738. Conventional processing is then used to add metal interconnect layers and a passivation layer to complete the integrated circuit processing.

The silicide layers 3326 on the source and drain extensions provide an effective etch stop layer that protects the source and drain extensions 3004 from being partially etched away and damaged during contact etch. The silicide layers 3326 on the source and drain extensions also reduce transistor series resistance thus improving transistor performance.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of fabricating an integrated circuit, comprising the steps of:
   providing a semiconductor substrate having a gate formed over a channel region, source/drain extension regions in said substrate adjacent said gate, sidewall spacers adjacent said gate and over said source/drain extension regions, and source/drain regions in said substrate adjacent said source/drain extension regions and spaced from said channel region by said source/drain extension regions, said source/drain regions extending deeper into said substrate than said source/drain extension regions;
   forming a first silicide layer over said source/drain regions;
   at least partially removing said sidewall spacers exposing at least a portion of said source/drain extension regions; and
   forming a second silicide layer over said portion of said source/drain extension regions, by a process comprising the steps of:
      forming a silicide forming metal layer on said integrated circuit, contacting said portion of said source/drain extension regions;
      heating said semiconductor substrate to form said second silicide layer; and
      removing unreacted metal of said silicide forming metal layer.

2. The method of claim 1 in which said first and second silicide layers are selected from the group consisting of:
   titanium silicide;
   cobalt silicide;
   nickel silicide;
   nickel-platinum silicide; and
   platinum silicide.

3. The method of claim 1 in which said first and second silicide layers are nickel-platinum silicide.

4. The method of claim 3 wherein said nickel-platinum silicide is formed by depositing a layer of nickel-platinum to a thickness between 2 and 6 nanometers.

5. The method of claim 4 in which said thickness is 3 nanometers.

6. The method of claim 5 in which said nickel-platinum silicide is formed at a temperature between 100° C. and 500° C.

7. The method of claim 6 in which said temperature is 250° C.

8. A method of fabricating an integrated circuit, comprising the steps of:
   providing a semiconductor substrate having a gate formed over a channel region, source/drain extension regions in said substrate adjacent said gate, first sidewall spacers adjacent said gate and over said source/drain extension regions, and source/drain regions in said substrate adjacent said source/drain extension regions and spaced from said channel region by said source/drain extension regions, said source/drain regions extending deeper into said substrate than said source/drain extension regions;
   at least partially removing said sidewall spacers exposing at least a portion of said source/drain extension regions;
   forming a first silicide layer over said source/drain regions and said portion of said source/drain extension regions;
   forming second sidewall spacers adjacent said gate and over a portion of said first silicide layer over said source/drain extension regions; and
   forming a second silicide layer over said source/drain regions.

9. The method of claim 8 in which said first and second silicide layers are selected from the group consisting of:
   titanium silicide;
   cobalt silicide;
   nickel silicide;
   nickel-platinum silicide; and
   platinum silicide.

10. The method of claim 8 in which said first and second silicide layers are nickel-platinum silicide.

11. The method of claim 10 wherein said nickel-platinum silicide is formed by depositing a layer of nickel-platinum to a thickness between 2 and 6 nanometers.

12. The method of claim 11 in which said thickness is 3 nanometers.

13. The method of claim 12 in which said nickel-platinum silicide is formed at a temperature between 100° C. and 500° C.

14. The method of claim 13 in which said temperature is 250° C.

* * * * *